(12) United States Patent
Agarwal et al.

(10) Patent No.: US 8,627,244 B2
(45) Date of Patent: Jan. 7, 2014

(54) FREQUENCY DOMAIN LAYOUT DECOMPOSITION IN DOUBLE PATTERNING LITHOGRAPHY

(75) Inventors: Kanak B. Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 13/171,513

(22) Filed: Jun. 29, 2011

(65) Prior Publication Data

US 2013/0003108 A1    Jan. 3, 2013

(51) Int. Cl.
*G06F 17/50*    (2006.01)

(52) U.S. Cl.
USPC .......................................................... 716/55

(58) Field of Classification Search
USPC .......................................................... 716/55
See application file for complete search history.

(56) References Cited

U.S. PATENT DOCUMENTS

| | | | |
|---|---|---|---|
| 7,824,842 B2 | 11/2010 | Finders | |
| 2008/0222587 A1 | 9/2008 | Smayling et al. | |
| 2008/0301620 A1* | 12/2008 | Ye et al. | 716/19 |
| 2010/0037200 A1* | 2/2010 | Ghan et al. | 716/21 |
| 2010/0115489 A1 | 5/2010 | Song et al. | |
| 2010/0199256 A1 | 8/2010 | Burns et al. | |
| 2010/0311242 A1 | 12/2010 | Deng et al. | |
| 2012/0102442 A1* | 4/2012 | Ghan et al. | 716/55 |
| 2012/0124529 A1* | 5/2012 | Feng et al. | 716/54 |

OTHER PUBLICATIONS

Babcock, Carl et al., "Double dipole RET investigation for 32 nm metal layers", Proceedings of the SPIE—The International Society for Optical Engineering, vol. 7122, Monterey, California, Oct. 7, 2008, 9 pages.

Dusa, Mircea et al., "Prospects and Initial Exploratory Results for Double Exposure/Double Pitch Technique", IEEE International Symposium on Semiconductor Manufacturing, ASML, Santa Clara, California, Sep. 13-15, 2005, pp. 177-180.

Kahng, Andrew B. et al., "Layout Decomposition Approaches for Double Patterning Lithography", IEEE Transactions on Computer-Aided Design of Integrated Circuits and Systems, vol. 29, No. 6, Jun. 2010, pp. 939-952.

Yuan, Kun et al., "Double Patterning Layout Decomposition for Simultaneous Conflict and Stitch Minimization", IEEE Transactions on Computer-Aided Design of Integrated Circuits and Systems, vol. 29, No. 2, Feb. 2010, pp. 185-196.

* cited by examiner

*Primary Examiner* — Vuthe Siek
*Assistant Examiner* — Mohammed Alam
(74) *Attorney, Agent, or Firm* — Stephen R. Tkacs; Stephen J. Walder, Jr.; Eustus D. Nelson

(57) ABSTRACT

A mechanism is provided for frequency domain layout decomposition in double pattern lithography (DPL) based on Fourier coefficient optimization (FCO). The Fourier transform of a layout represents the spatial frequency terms present in the layout. The mechanism models decomposed patterns for two exposures as a function of the corresponding Fourier coefficients. For each exposure, the mechanism sets the corresponding Fourier coefficients to zero for spatial frequency terms greater than the cut-off frequency of the optical system. The mechanism then optimizes non-zero Fourier coefficients for the two exposures to decompose the original target. The mechanism provides frequency domain optimization instead of conventional spatial domain methods, which naturally leads to optics-aware decomposition and stitch insertion in arbitrary two dimensional patterns.

20 Claims, 5 Drawing Sheets

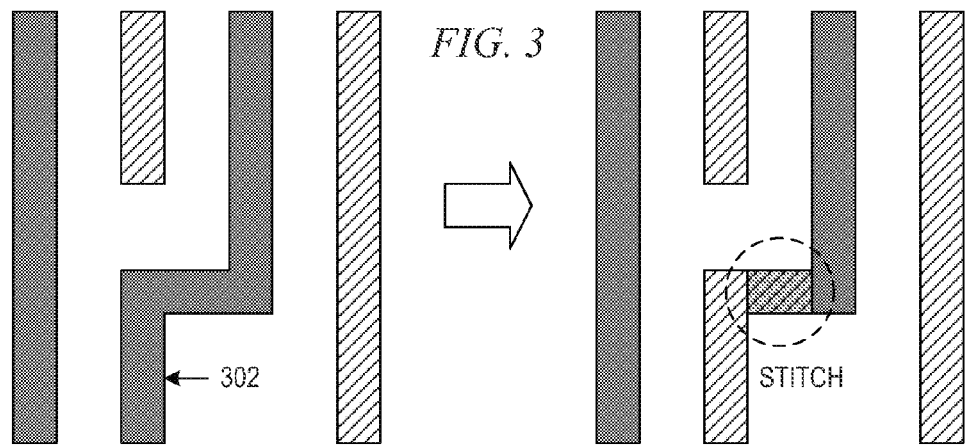
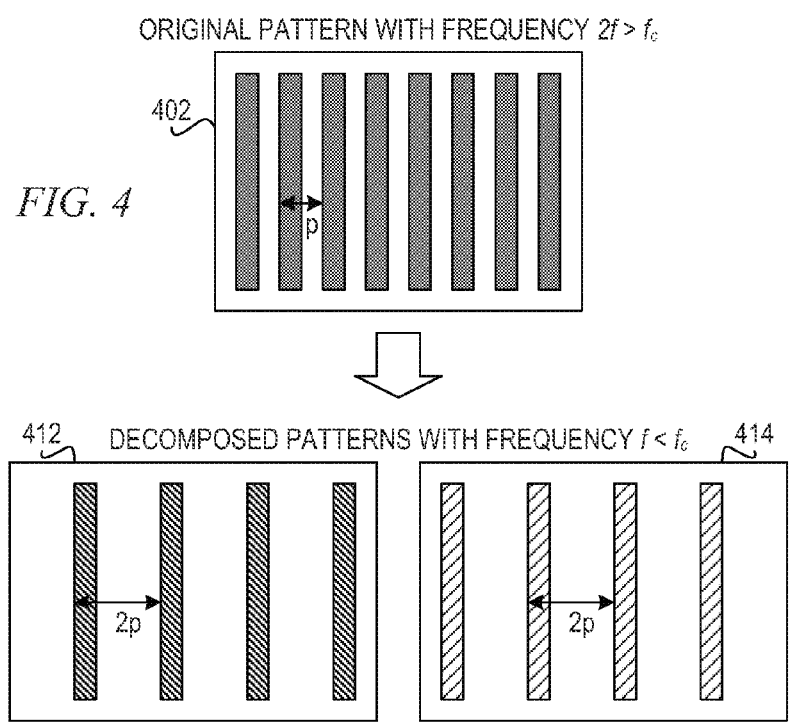

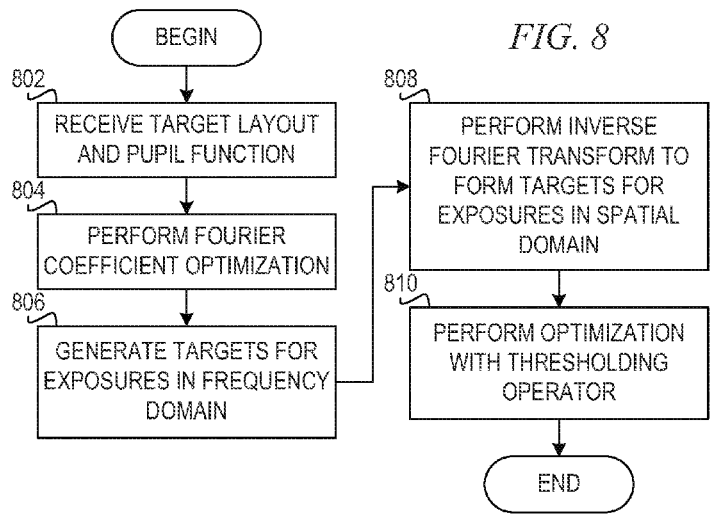
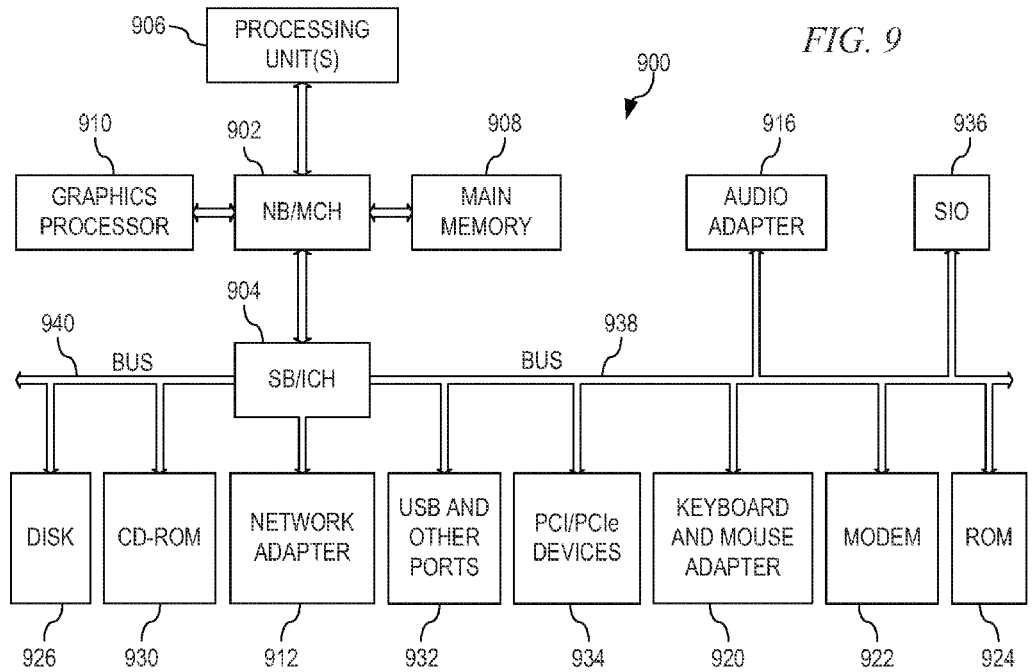

FREQUENCY DOMAIN LAYOUT DECOMPOSITION IN DOUBLE PATTERNING LITHOGRAPHY

BACKGROUND

The present application relates generally to an improved data processing apparatus and method and more specifically to mechanisms for frequency domain layout decomposition in double patterning lithography.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Multiple patterning is a class of technologies developed for photolithography to enhance the feature density. The simplest case of multiple patterning is double patterning, where a conventional lithography process is enhanced to produce double the expected number of features. Double exposure is a sequence of two separate exposures of the same photoresist layer using two different photomasks. This technique is commonly used for patterns in the same layer which have incompatible densities or pitches. In one important case, the two exposures may each consist of lines which are oriented in one or the other of two usually perpendicular directions. This allows the decomposition of two-dimensional patterns into two one-dimensional patterns which are easier to print.

Double pattern lithography (DPL) is an effective technique to improve resolution. DPL theoretically doubles resolution through pitch splitting such that effective pitch of the layout for each patterning step is halved. DPL involves two separate exposure and etch/freeze steps (litho-etch-litho-etch or litho-freeze-litho-etch). DPL is expected to be needed for 20 nm technology and is one of the best candidate solutions for scaling to 14 nm technology and beyond.

For one-dimensional patterns at minimum pitch, layout decomposition for double patterning is trivial. Decomposition is very complex for more complicated two-dimensional patterns. DPL layout decomposition solutions typically cast layout decomposition as a graph coloring problem where two features less than a certain minimum spacing must be assigned different colors. DPL decomposition is very challenging to implement at the hill-chip level, particularly when stitch insertion is considered. A stitch insertion in a polygon during decomposition indicates that one part of the polygon will be printed in the first patterning step while the remaining part of the polygon will be printed using second patterning, with the two parts joining together at the stitch location. Stitches can help in removing decomposition conflicts but they can potentially break a polygon into multiple pieces. All possible stitch insertion locations must be explicitly considered in the graph during coloring.

DPL may provide wafer-level frequency doubling. In a diffraction limited optical system, the objective lens acts as a low pass filter with a spatial cutoff frequency determined by NA/$\lambda$, which are properties of the optical system. NA is numerical aperture of the objective lens and $\lambda$ is the wavelength of the light. Double patterning can essentially provide wafer-level frequency doubling through two exposures. If the fundamental cut-off frequency of each exposure is $f_c$, double patterning can theoretically achieve $2f_c$ spatial frequency resolution. An ideal decomposition should split a target such that the spatial frequency in each layout is below the cut-off frequency of the system.

SUMMARY

In one illustrative embodiment, a method, in a data processing system, is provided for layout decomposition in double patterning lithography. The method comprises receiving a target layout for performing a multiple patterning photolithographic process to form an integrated circuit design, determining a spatial cut-off frequency or low pass filter function of individual exposure in the multiple patterning photolithographic process, generating a first frequency domain representation of decomposed layout and a second frequency domain representation of decomposed layout for performing the multiple patterning photolithographic process based on the single exposure cut-off frequency or low pass filter function, converting the first frequency domain representation and the second frequency domain representation into a spatial domain target for first exposure and a spatial domain target for second exposure respectively, and performing the multiple patterning photolithographic process using the first spatial domain exposure target and the second spatial domain exposure target.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 3 is a diagram illustrating decomposition of layout with two-dimensional patterns in accordance with an example embodiment;

FIG. 4 illustrates wafer-level frequency doubling using double patterning lithography in accordance with an example embodiment;

FIG. 8 is a flowchart illustrating operation of a mechanism for layout decomposition in double patterning lithography with Fourier coefficient optimization in accordance with an illustrative embodiment; and FIG. 9 is a block diagram of an example data processing system in which aspects of the illustrative embodiments may be implemented.

DETAILED DESCRIPTION

The illustrative embodiments provide a mechanism for frequency domain layout decomposition in double pattern lithography (DPL). The Fourier transform of a layout represents the spatial frequency terms present in the layout. The mechanism models decomposed patterns for two exposures as a function of the corresponding Fourier coefficients. For each exposure, the mechanism sets the corresponding Fourier coefficients to zero for spatial frequency terms greater than the cut-off frequency of the optical system. The mechanism then optimizes non-zero Fourier coefficients for the two exposures to decompose the original target. The mechanism provides frequency domain optimization instead of conventional spatial domain decomposition methods, which naturally leads to optics-aware decomposition and stitch insertion in arbitrary two dimensional patterns.

Figure 1:
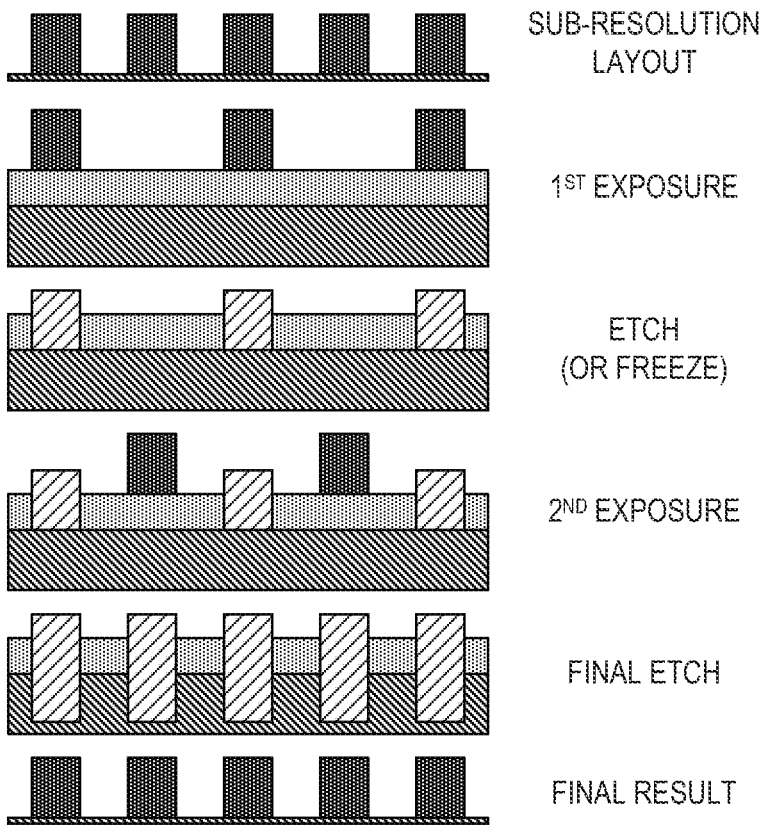
FIG. 1 illustrates pitch split double patterning flow in accordance with an example embodiment.

FIG. 1 illustrates pitch split double patterning flow in accordance with an example embodiment. The flow shown in FIG. 1 represents a litho-etch-litho-etch, or LELE, technique. The flow begins with a sub-resolution layout, which is the target design to be achieved. The flow makes a first exposure, performs an etch, makes a second exposure, and performs a final etch. Ideally, the final result should resemble the sub-resolution layout.

Figure 2:
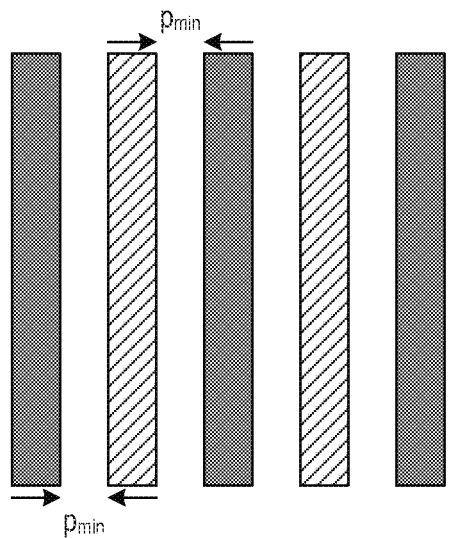
FIG. 2 is a diagram illustrating simple one-dimensional patterns at minimum pitch in accordance with an example embodiment.

FIG. 2 is a diagram illustrating simple one-dimensional patterns at minimum pitch in accordance with an example embodiment. With the patterns shown in FIG. 2, decomposition is trivial with alternating shapes appearing in separate exposures. Decomposition can become complex for more complicated two dimensional patterns. FIG. 3 is a diagram illustrating decomposition of layout with two-dimensional patterns. As seen in FIG. 3, shape 302 cannot be placed in one exposure, resulting in a "graph coloring" problem because two features less than a certain minimum spacing must be assigned different colors (exposures). With these complex shapes, double patterning lithography is very challenging to implement at the full-chip level, particularly when stitch insertion is to be considered. As shown in FIG. 3, a stitch can break a polygon—in this case shape 302—into multiple pieces. A stitch is where the pieces meet and overlap joining the two pieces into a single shape. All possible stitch locations must be explicitly considered in the graph for layout decomposition.

FIG. 4 illustrates wafer-level frequency doubting using double patterning lithography in accordance with an example embodiment. In a diffraction limited optical system, the objective lens acts as a low pass filter with a spatial cut-off frequency determined by NA/λ. Double patterning can essentially provide wafer-level frequency doubling through two exposures. Consider an original pattern 402 with a spatial frequency of 2f, which is greater than the cut-off frequency, $f_c$ of single exposure optical system. Using double patterning, one decomposes the original pattern 402 into two patterns 412, 414 each having a frequency of f, which is less than $f_c$. This decomposition method ensures that each of the decomposed patterns in printable by the optical system.

In a simple case, the cut-off frequency depends on NA and λ. The cut-off frequency can also depend on other parameters of the optical system besides λ and NA. Furthermore instead of a hard cut-off frequency, an example embodiment may use a continuous low pass filtering function that performs two-dimensional frequency domain filtering; the parameters of this function can also be obtained from the properties of the optical system. The cut-off frequency or low pass filtering function parameters may also depend on various computational steps used for mask optimization such as Optical Proximity Correction (OPC).

While the description refers to double patterning lithography for simplicity, the illustrative embodiments apply to multiple patterning lithography having more than two exposures as well.

In accordance with the illustrative embodiments, a mechanism is provided for Fourier coefficient optimization (FCO) for layout decomposition in double patterning lithography (DPL). The Fourier transform M(u,v) of a layout m(x,y) represents the spatial frequency terms present in the layout. The mechanism models decomposed patterns for two exposures as functions of the corresponding Fourier coefficients. For each exposure, the mechanism sets the corresponding Fourier coefficients to zero for spatial frequency terms greater than the cut-off frequency of the optical system. The mechanism then optimizes the non-zero Fourier coefficients for the two exposures to decompose the original target.

Figure 5:
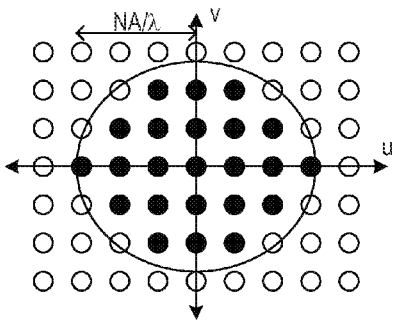
FIG. 5 depicts a band-limited filter for a lens aperture in accordance with the illustrative embodiments.

The Fourier transform M(u,v) of the layout m(x,y) represents the coherent field distribution in the Fraunhofer diffraction plane. FIG. 5 depicts an example of discrete diffraction orders and band-limited filtering provided by objective lens aperture in an optical lithography system in accordance with the illustrative embodiments. The lens aperture collects certain diffraction orders within the pupil. The pupil function P(u,v) is band limited based on the cut-off frequency resulting the loss of image information due to loss of higher diffraction orders. The pupil function P(u,v) can be expressed as follows:

$$P(u,v) = \begin{cases} 1, & \text{if } \sqrt{u^2+v^2} < \frac{NA}{\lambda}, \\ 0, & \text{otherwise} \end{cases}$$

where NA represents the numerical aperture of the lens and λ represents the wavelength of the light used in imaging. The optimization problem for double patterning layout decomposition is to find two band-limited diffraction patterns, which when combined after inverse Fourier transform (IFT) produce the original spatial domain target layout.

Thus, the illustrative embodiments provide a mechanism for defining the layout in terms of Fourier coefficients. Let $H_1(u,v)$ and $H_2(u,v)$ represent the diffraction patterns (Fourier transforms) of the decomposed layout patterns. Under the band-limited constraint, the decomposed layouts may be expressed as follows:

$$L_1 = Re[\mathfrak{I}^{-1}\{H_1(u,v)P(u,v)\}]$$

$$L_2 = Re[\mathfrak{I}^{-1}\{H_2(u,v)P(u,v)\}]$$

The combined target from these band-limited diffraction patterns may then be expressed as follows:

$$\hat{L}(x, y) = \text{Re}\left[\sum_{0}^{N-1}\sum_{0}^{N-1} H_1(u, v) \cdot P(u, v) e^{2\pi i\left(\frac{xu}{N}+\frac{yv}{N}\right)}\right] + \text{Re}\left[\sum_{0}^{N-1}\sum_{0}^{N-1} H_2(u, v) \cdot P(u, v) e^{2\pi i\left(\frac{xu}{N}+\frac{yv}{N}\right)}\right]$$

The objective is to optimize Fourier coefficients $H_1(u,v)$ and $H_2(u,v)$ to minimize norm-based cost function:

$$C=\|L(x,y)-\hat{L}(x,y)\|_2$$

The optimization objective is defined in a way such that the sum of the layouts from the two diffraction patterns must be close to the original layout $L(x,y)$.

The mechanism may perform gradient descent based optimization in accordance with an example embodiment. The minimum cost function may be found by gradient descent. The gradient of the cost function with respect to Fourier coefficients may be analytically calculated as follows:

$$\frac{\partial C}{\partial H_1(u, v)} = P(u, v) \cdot D(u, v)$$

where $$D(u, v) = \mathfrak{I}\{-2(L(x, y) - \hat{L}(x, y))\}$$

The gradient of cost function with respect to Fourier coefficients can be computed very efficiently with one Fast Fourier Transform (FFT) operation.

The mechanism of the illustrative embodiments may then steer optimization to produce binary layout patterns for the two exposures. The mechanism may perform optimization with a thresholding operator, $\Phi$, to snap pixel values as follows:

$$\hat{L}_1(x,y)=\Phi(L_1(x,y))$$

$$\hat{L}_2(x,y)=\Phi(L_2(x,y))$$

$$\Phi(z)=(1+\exp[-\alpha(z-0.5)])^{-1}$$

Figure 6:
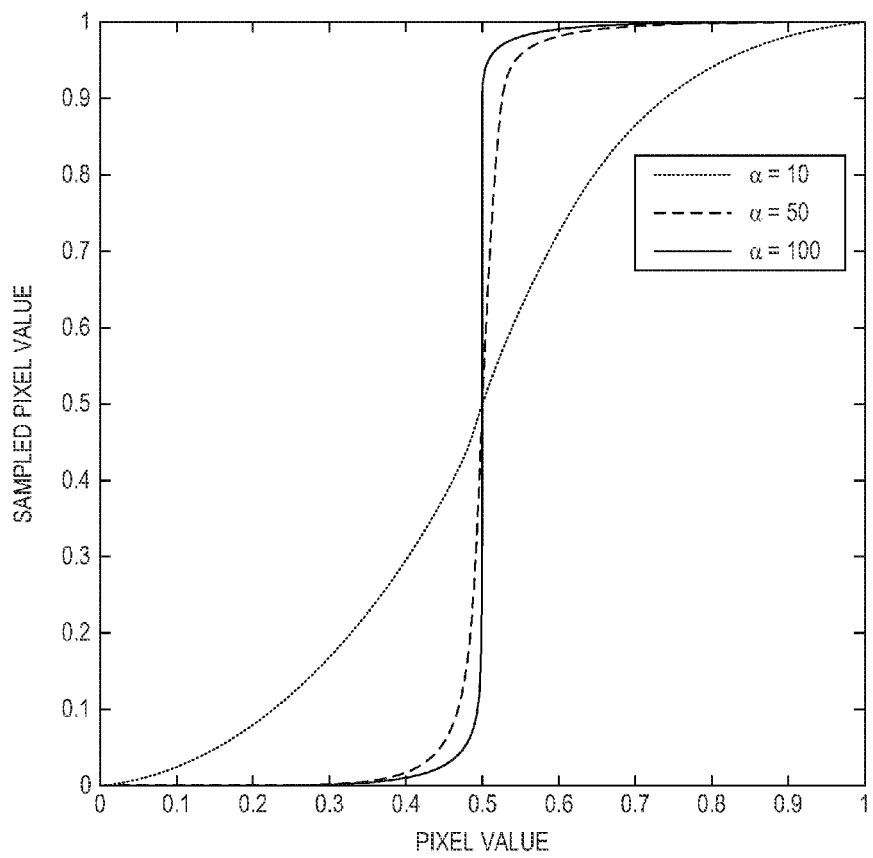
FIG. 6 is a graph illustrating snapping pixel values using a thresholding operator in accordance with an illustrative embodiment.

FIG. 6 is a graph illustrating snapping pixel values using a thresholding operator in accordance with an illustrative embodiment. The graph in FIG. 6 shows pixel snapping for various values of $\alpha$.

Figure 7:
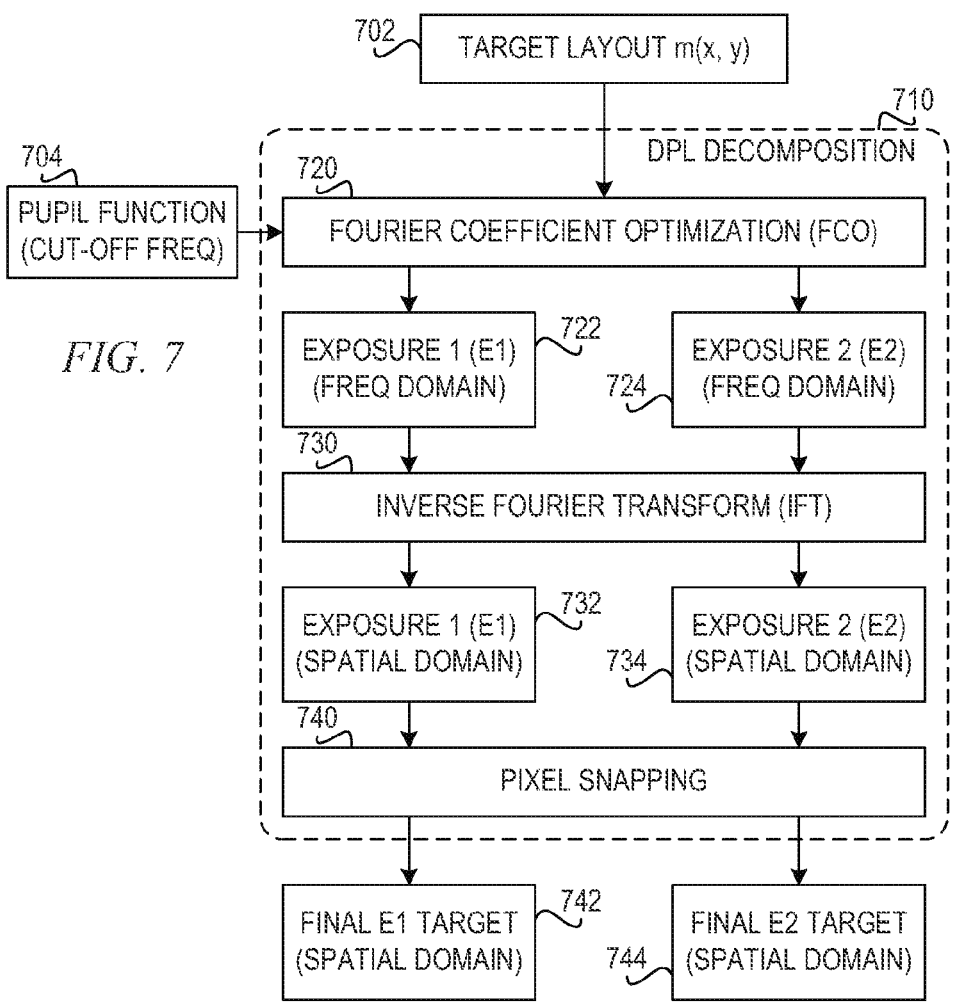
FIG. 7 is a block diagram illustrating double patterning decomposition flow with Fourier coefficient optimization in accordance with an illustrative embodiment.

FIG. 7 is a block diagram illustrating double patterning decomposition flow with Fourier coefficient optimization in accordance with an illustrative embodiment. Double patterning lithography (DPL) decomposition mechanism 710 receives a target layout m(x,y) 702 and a pupil function with a cut-off frequency 704. DPL, decomposition mechanism 710 comprises Fourier coefficient optimization (FCO) component 720, inverse Fourier transform (IFT) component 730, and pixel snapping component 740.

FCO component 720 decomposes target layout 702 into frequency domain target for exposure 1 (E1) 722 and frequency domain target for exposure 2 (E2) 724 based on pupil function 704. E1 722 and E2 724 are in the frequency domain. IFT component 730 converts frequency domain E1 722 and frequency domain E2 724 into spatial domain target for exposure 1 (E1) 732 and spatial domain target for exposure 2 (E2) 734, respectively. Pixel snapping component 740 converts spatial domain E1 732 into final E1 target in the spatial domain 742 and converts spatial domain E2 734 into final E2 target in the spatial domain 744.

The mechanism of the illustrative embodiment decomposes the target layout into two target layouts, one for each exposure of the double patterning lithography process. The depicted example shows application of the illustrative embodiment to double patterning lithography; however, the mechanism of the illustrative embodiments also applies to multiple patterning lithography with more than two exposures.

The mechanisms of the illustrative embodiments address key challenges of layout decomposition for double patterning lithography implementations in 15 nm node and beyond. The illustrative embodiments leverage highly optimized FFT O(nlogn) computations. The frequency domain flow naturally leads to optics-aware decomposition and stitch insertion in arbitrary two dimensional patterns.

As will be appreciated by one skilled in the art, the present invention may be embodied as a system, method, or computer program product. Accordingly, aspects of the present invention may take the form of an entirety hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 8 is a flowchart illustrating operation of a mechanism for layout decomposition in double patterning lithography with Fourier coefficient optimization in accordance with an illustrative embodiment. Operation begins, and the mechanism receives a target layout and pupil function (block 802). The mechanism performs Fourier coefficient optimization based on the target layout and pupil function (block 804) and generates targets for the two exposures in the frequency domain (block 806). The mechanism then performs an inverse Fourier transform on the frequency domain targets to form targets in the spatial domain (block 808). Then, the mechanism performs optimization with a thresholding operator to form final decomposed targets in the spatial domain (block 810). Thereafter, operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments may be utilized in many different types of data processing environments including a distributed data processing environment, a single data processing device, or the like. In order to provide a context for the description of the specific elements and functionality of the illustrative embodiments, FIG. 9 is provided hereafter as an example environment in which aspects of the illustrative embodiments may be implemented. It should be appreciated that FIG. 9 is only an example and is not intended to assert or imply any limitation with regard to the environments in which aspects or embodiments of the present invention may be implemented. Many modifications to the depicted environment may be made without departing from the spirit and scope of the present invention.

FIG. 9 is a block diagram of an example data processing system in which aspects of the illustrative embodiments may be implemented. Data processing system 900 is an example of a computer in which computer usable code or instructions implementing the processes for illustrative embodiments of the present invention may be located.

In the depicted example, data processing system 900 employs a hub architecture including north bridge and memory controller hub (NB/MCH) 902 and south bridge and input/output (I/O) controller hub (SB/ICH) 904. Processing unit 906, main memory 908, and graphics processor 910 are connected to NB/MCH 902. Graphics processor 910 may be connected to NB/MCH 902 through an accelerated graphics port (AGP).

In the depicted example, local area network (LAN) adapter 912 connects to SB/ICH 904. Audio adapter 916, keyboard and mouse adapter 920, modem 922, read only memory (ROM) 924, hard disk drive (HDD) 926, CD-ROM drive 930, universal serial bus (USB) ports and other communication ports 932, and PCI/PCIe devices 934 connect to SB/ICH 904 through bus 938 and bus 940, PCI/PCIe devices may include, for example, Ethernet adapters, add-in cards, and PC cards for notebook computers. PCI uses a card bus controller, while PCIe does not. ROM 924 may be, for example, a flash basic input/output system (BIOS).

HDD 926 and CD-ROM drive 930 connect to SB/ICH 904 through bus 940. HDD 926 and CD-ROM drive 930 may use, for example, an integrated drive electronics (IDE) or serial advanced technology attachment (SATA) interface. Super I/O (SIO) device 936 may be connected to SB/ICH 904.

An operating system runs on processing unit 906. The operating system coordinates and provides control of various components within the data processing system 900 in FIG. 9. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 900 (Java is a trademark of Oracle and/or its affiliates).

As a server, data processing system 900 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 900 may be a symmetric multiprocessor (SMP) system including a plurality of processors in processing unit 906. Alternatively, a single processor system may be employed.

Instructions for the operating system, the object-oriented programming system, and applications or programs are located on storage devices, such as HDD 926, and may be loaded into main memory 908 for execution by processing unit 906. The processes for illustrative embodiments of the present invention may be performed by processing unit 906 using computer usable program code, which may be located in a memory such as, for example, main memory 908, ROM 924, or in one or more peripheral devices 926 and 930, for example.

A bus system, such as bus 938 or bus 940 as shown in FIG. 9, may be comprised of one or more buses. Of course, the bus system may be implemented using any type of communication fabric or architecture that provides for a transfer of data between different components or devices attached to the fabric or architecture. A communication unit, such as modem 922 or network adapter 912 of FIG. 9, may include one or more devices used to transmit and receive data. A memory may be, for example, main memory 908, ROM 924, or a cache such as found in NB/MCH 902 in FIG. 9.

Those of ordinary skill in the art will appreciate that the hardware in FIG. 9 may vary depending on the implementation. Other internal hardware or peripheral devices, such as flash memory, equivalent non-volatile memory, or optical disk drives and the like, may be used in addition to or in place of the hardware depicted in FIG. 9. Also, the processes of the illustrative embodiments may be applied to a multiprocessor data processing system, other than the SMP system mentioned previously, without departing from the spirit and scope of the present invention.

Moreover, the data processing system 900 may take the form of any of a number of different data processing systems including client computing devices, server computing devices, a tablet computer, laptop computer, telephone or other communication device, a personal digital assistant (PDA), or the like. In some illustrative examples, data processing system 900 may be a portable computing device which is configured with flash memory to provide non-volatile memory for storing operating system files and/or user-generated data, for example. Essentially, data processing system 900 may be any known or later developed data processing system without architectural limitation.

Thus, the illustrative embodiments provide mechanisms for frequency domain layout decomposition in double pattern lithography (DPL). The Fourier transform of a layout represents the spatial frequency terms present in the layout. The mechanism models decomposed patterns for two exposures as a function of the corresponding Fourier coefficients. For each exposure, the mechanism sets the corresponding Fourier coefficients to zero for spatial frequency terms greater than the cut-off frequency of the optical system. The mechanism then optimizes non-zero Fourier coefficients for the two exposures to decompose the original target. The mechanism provides frequency domain optimization instead of conventional spatial domain methods, which naturally leads to optics-aware decomposition and stitch insertion in arbitrary two dimensional patterns.

The mechanisms of the illustrative embodiments address key challenges of layout decomposition for double patterning lithography implementations in 15 nm node and beyond. The illustrative embodiments leverage highly optimized FFT O(nlogn) computations. The frequency domain flow naturally leads to optics-aware decomposition and stitch insertion in arbitrary two dimensional patterns.

The illustrative embodiments and depicted examples show double patterning lithography; however, the aspects of the illustrative embodiments my apply to three or more exposures. In addition, the pupil function (low pass filter), optimization objective function, and pixel thresholding operator may be modified depending upon the implementation. Example functions are shown for each, but other functions can also be used.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method by a data processing system comprising a processor, for layout decomposition in multiple patterning lithography, the method comprising:
   receiving a target layout for performing a multiple patterning photolithographic process to form an integrated circuit design;
   determining a cut-off frequency or low pass filter function of individual exposures in the multiple patterning photolithographic process;
   generating at least a first frequency domain target for a first exposure and a second frequency domain target for a second exposure for performing the multiple patterning photolithographic process based on the cut-off frequency or low pass filter function;

converting the first frequency domain target and the second frequency domain target into a first spatial domain target for first exposure and a second spatial domain target for second exposure; and performing the multiple patterning photolithographic process using the first spatial domain target and the second spatial domain target.

2. The method of claim 1, wherein determining the cut-off frequency comprises:

receiving properties of an optical system, including wavelength of the light ($\lambda$) and numerical aperture of a lens (NA) used in the optical system; and determining the cut-off frequency based on the properties of the optical system.

3. The method of claim 1, wherein generating the first frequency domain target and the second frequency domain target comprises:

performing Fourier coefficient optimization on the target layout based on the cut-off frequency or low pass filter function to form the first frequency domain target and the second frequency domain target.

4. The method of claim 3, wherein performing Fourier coefficient optimization comprises:

for the first frequency domain target and the second frequency domain target, setting corresponding Fourier coefficients for spatial frequency terms greater than the cut-off frequency to zero; and optimizing non-zero Fourier coefficients for the first frequency domain target and the second frequency domain target.

5. The method of claim 3, wherein performing Fourier coefficient optimization comprises:

applying a two-dimensional low pass filtering function to the Fourier coefficients of the first frequency domain target and the second frequency domain target.

6. The method of claim 3, wherein performing Fourier coefficient optimization comprises:

optimizing filtered Fourier coefficients for the first frequency domain target and the second frequency domain target.

7. The method of claim 1, wherein converting the first frequency domain target and the second frequency domain target into a first spatial domain target and a second spatial domain target comprises:

performing an inverse Fourier transform on the first frequency domain target to form a first spatial domain target; and performing an inverse Fourier transform on the second frequency domain target to form a second spatial domain target.

8. The method of claim 7, wherein converting the first frequency domain target and the second frequency domain target into a first spatial domain target and a second spatial domain target further comprises:

performing optimization with a thresholding operator on the first spatial domain target and the second spatial domain target to snap pixel values.

9. A computer readable storage device having a computer readable program stored therein, wherein the computer readable program, when executed on a computing device, causes the computing device to:

receive a target layout for performing a multiple patterning photolithographic process to form an integrated circuit design;

determine a cut-off frequency or low pass filter function of individual exposures in the multiple patterning photolithographic process;

generate at least a first frequency domain target for a first exposure and a second frequency domain target for a second exposure for performing the multiple patterning photolithographic process based on the cut-off frequency or low pass filter function;

convert the first frequency domain target and the second frequency domain target into a first spatial domain target for first exposure and a second spatial domain target for second exposure; and perform the multiple patterning photolithographic process using the first spatial domain target and the second spatial domain target.

10. The computer readable storage device of claim 9, wherein determining the cut-off frequency comprises:

receiving properties of an optical system, including wavelength of the light ($\lambda$) and numerical aperture of a lens (NA) used in the optical system; and determining the cut-off frequency based on the properties of the optical system.

11. The computer readable storage device of claim 9, wherein generating the first frequency domain target and the second frequency domain target comprises:

performing Fourier coefficient optimization on the target layout based on the cut-off frequency or low pass filter function to form the first frequency domain target and the second frequency domain target.

12. The computer readable storage device of claim 11, wherein performing Fourier coefficient optimization comprises:

for the first frequency domain target and the second frequency domain target, setting corresponding Fourier coefficients for spatial frequency terms greater than the cut-off frequency to zero; and optimizing non-zero Fourier coefficients for the first frequency domain target and the second frequency domain target.

13. The computer readable storage device of claim 9, wherein converting the first frequency domain target and the second frequency domain target into a first spatial domain target and a second spatial domain target comprises:

performing an inverse Fourier transform on the first frequency domain target to form a first spatial domain target; and performing an inverse Fourier transform on the second frequency domain target to form a second spatial domain target.

14. The computer readable storage device of claim 13, wherein converting the first frequency domain target and the second frequency domain target into a first spatial domain target and a second spatial domain target further comprises:

performing optimization with a thresholding operator on the first spatial domain target and the second spatial domain target to snap pixel values.

15. The computer readable storage device of claim 9, wherein the computer readable program is stored in a computer readable storage medium in a data processing system and wherein the computer readable program was downloaded over a network from a remote data processing system.

16. The computer readable storage device of claim 9, wherein the computer readable program is stored in a computer readable storage medium in a server data processing system and wherein the computer readable program is downloaded over a network to a remote data processing system for use in a computer readable storage medium with the remote system.

17. An apparatus, comprising:
a processor; and
a memory coupled to the processor, wherein the memory comprises instructions which, when executed by the processor, cause the processor to:
receive a target layout for performing a multiple patterning photolithographic process to form an integrated circuit design;
determine a cut-off frequency or low pass filter function of individual exposures in the multiple patterning photolithographic process;
generate at least a first frequency domain target for a first exposure and a second frequency domain target for a second exposure for performing the multiple patterning photolithographic process based on the cut-off frequency or low pass filter function;
convert the first frequency domain target and the second frequency domain target into a first spatial domain target for first exposure and a second spatial domain target for second exposure; and
perform the multiple patterning photolithographic process using the first spatial domain target and the second spatial domain target.

18. The apparatus of claim 17, wherein determining the cut-off frequency comprises:
receiving properties of an optical system, including wavelength of the light ($\lambda$) and numerical aperture of a lens (NA) used in the optical system; and
determining the cut-off frequency based on the properties of the optical system.

19. The apparatus of claim 17, wherein generating the first frequency domain target and the second frequency domain target comprises:
performing Fourier coefficient optimization on the target layout based on the cut-off frequency or low pass filter function to form the first frequency domain target and the second frequency domain target.

20. The apparatus of claim 17, wherein converting the first frequency domain target and the second frequency domain target into a first spatial domain target and a second spatial domain target comprises:
performing an inverse Fourier transform on the first frequency domain target to form a first spatial domain target; and
performing an inverse Fourier transform on the second frequency domain target to form a second spatial domain target.

* * * * *